United States Patent
Asakawa

(10) Patent No.: US 7,750,468 B2
(45) Date of Patent: Jul. 6, 2010

(54) SEMICONDUCTOR DEVICE AND METHOD FOR MANUFACTURING THE SAME

(75) Inventor: Tatsuhiko Asakawa, Fujimi (JP)

(73) Assignee: Seiko Epson Corporation (JP)

( * ) Notice: Subject to any disclaimer, the term of this patent is extended or adjusted under 35 U.S.C. 154(b) by 194 days.

(21) Appl. No.: 12/032,730

(22) Filed: Feb. 18, 2008

(65) Prior Publication Data

US 2008/0197505 A1 Aug. 21, 2008

(30) Foreign Application Priority Data

Feb. 19, 2007 (JP) .............................. 2007-037620

(51) Int. Cl.
*H01L 23/48* (2006.01)

(52) U.S. Cl. ...................... 257/737; 257/738; 257/739; 257/784; 257/E21.507; 257/E21.508; 257/E23.019; 257/E23.021; 438/613; 438/614; 438/617

(58) Field of Classification Search ................. 257/737, 257/738, 739, 784, E21.507, E21.508, E23.109, 257/E23.021; 438/613, 614, 617
See application file for complete search history.

(56) References Cited

U.S. PATENT DOCUMENTS

2004/0245621 A1* 12/2004 Hanaoka et al. ............. 257/690
2006/0288572 A1* 12/2006 Tanaka et al. ................ 29/846

FOREIGN PATENT DOCUMENTS

JP  2005-353983  12/2005

* cited by examiner

*Primary Examiner*—Andy Huynh
(74) *Attorney, Agent, or Firm*—Harness, Dickey & Pierce, P.L.C.

(57) ABSTRACT

A semiconductor device includes: a semiconductor substrate that has an integrated circuit, a passivation film formed above the integrated circuit, and an electrode electrically connected to the integrated circuit, the passivation film having an uneven surface, the electrode having at least a portion exposed through the passivation film; a first resin layer that is disposed on the passivation film; a second resin layer that covers the passivation film and the first resin layer; and a wiring that extends from the electrode to a first part of the second resin layer above the first resin layer, the electrode passing on a second part of the second resin layer above the passivation film.

5 Claims, 2 Drawing Sheets

SEMICONDUCTOR DEVICE AND METHOD FOR MANUFACTURING THE SAME

The entire disclosure of Japanese Patent Application No. 2007-037620, filed Feb. 19, 2007 is expressly incorporated by reference herein.

BACKGROUND

1. Technical Field

The invention relates to semiconductor devices and methods for manufacturing the same.

2. Related Art

A semiconductor device may be equipped with electrode pads, resin layers and wirings disposed extending from the surface of the electrode pads to the surface of the resin layers (see, for example, Japanese Laid-open Patent Application JP-A-2005-353983). The resin layers and the wirings thereon form external terminals. The external terminals may be formed at a narrower pitch than that of external terminals formed from solder balls, and stress can be absorbed by the resin layers. The wirings are formed on a passivation film in an area between the electrode pads and the resin layers. The passivation film has an uneven surface according to the structure formed below. Therefore, the passivation film may affect the wirings formed thereon. In particular, when a conductive film is formed on the passivation film by sputtering, deposition of the film may become nonuniform if the surface is uneven. Since this may lead to an increase in the resistance value and line breakage, some countermeasures need to be implemented.

SUMMARY

According to an advantage of some aspects of the invention, the reliability of wirings formed on a passivation film can be improved.

(1) In accordance with an embodiment of the invention, a semiconductor device includes a semiconductor substrate that has an integrated circuit, a passivation film formed above the integrated circuit, and an electrode electrically connected to the integrated circuit, the passivation film having an uneven surface, the electrode having at least a portion exposed through the passivation film; a first resin layer that is disposed on the passivation film; a second resin layer that covers the passivation film and the first resin layer; and a wiring formed in a manner to extend from the electrode to a first part of the second resin layer above the first resin layer, the wiring passing on a second part of the second resin layer above the passivation film. According to the present embodiment, because a forming surface on which the wiring is formed is made smoother than the uneven surface of the passivation film by the second resin layer, the reliability of the wiring that is formed on the forming surface can be improved.

(2) In the semiconductor device described above, the second resin layer may have thermal resistance higher than that of the first resin layer.

(3) A method for manufacturing a semiconductor device in accordance with another embodiment of the invention includes the steps of: preparing a semiconductor substrate having a passivation film with an uneven surface due to being formed above an integrated circuit, and an electrode electrically connected to the integrated circuit, the electrode having at least a portion exposed through the passivation film; forming a first resin layer on the passivation film; forming a second resin layer that covers the passivation film and the first resin layer; and forming a wiring in a manner to extend from the electrode to a first part of the second resin layer above the first resin layer, the wiring passing on a second part of the second resin layer above the passivation film. According to the present embodiment, because a forming surface on which the wiring is formed can be made smoother than the uneven surface of the passivation film by the second resin layer, the reliability of the wiring that is formed on the forming surface can be improved.

(4) In the method for manufacturing a semiconductor device described above, forming of the first resin layer may include forming a thermosetting first resin precursor layer and heating the first resin precursor layer, and forming of the second resin layer may include forming a thermosetting second resin precursor layer after heating and setting the first resin precursor layer.

(8) In the method for manufacturing a semiconductor device described above, the second resin precursor layer may have thermal resistance higher than that of the first resin precursor layer.

DESCRIPTION OF EXEMPLARY EMBODIMENTS

Figure 1:
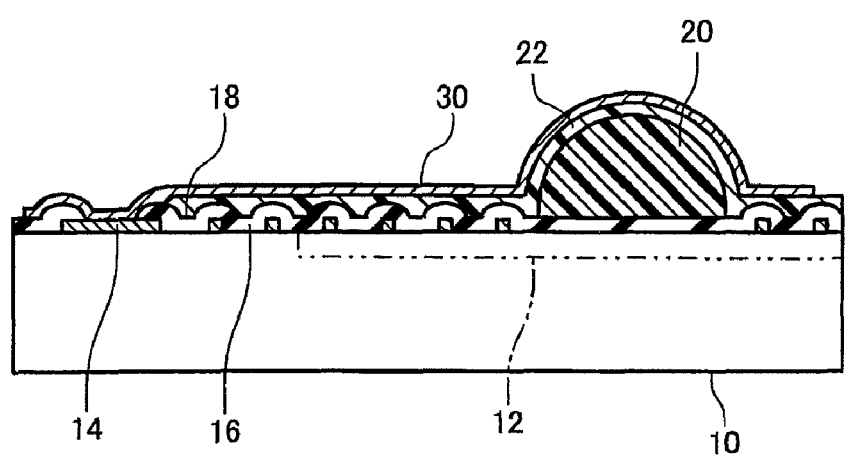
FIG. 1 is a cross-sectional view of a semiconductor device in accordance with an embodiment of the invention.

FIG. 1 is a cross-sectional view showing a semiconductor device in accordance with an embodiment of the invention. The semiconductor device includes a semiconductor substrate 10. The semiconductor substrate 10 may be a semiconductor chip in a semiconductor device as a final product, or may be a semiconductor wafer in the stage before final products are obtained. Semiconductor chips are obtained through cutting a semiconductor wafer. The semiconductor substrate 10 includes an integrated circuit 12 (a single integrated circuit 12 in a semiconductor chip or a plurality of integrated circuits 12 in a semiconductor wafer) formed therein. The semiconductor substrate 10 has an electrode 14 electrically connected to the integrated circuit 12 through an internal wiring (not shown). The semiconductor substrate 10 may be in an elongated shape in one direction (rectangular in a plane configuration), and a plurality of electrodes 14 may be arranged along the long side of the semiconductor substrate 10.

A passivation film 16 that exposes at least a portion of the electrode 14 is formed in the semiconductor substrate 10. The passivation film 16 may be formed only from an inorganic material, such as, for example, $SiO_2$, SiN and the like. The passivation film 16 is formed above the integrated circuit 12, and has an uneven surface.

A first resin layer 20 composed of, for example, polyimide resin is formed on a surface of the semiconductor substrate 10 where the electrode 14 is formed (on the passivation film 16). Also, a second resin layer 22 is formed in a manner to cover the passivation film 16 and the first resin layer 20. As the material of the first resin layer 20 and the second resin layer 22, polyimide resin, silicon modified polyimide resin, epoxy resin, silicon modified epoxy resin, benzocyclobutene (BCB), polybenzoxazole (PBO), phenol system resin and the like may be used. The second resin layer 22 is provided in a manner to fill recessed sections 18 of the passivation film 16. The second resin layer 22 is formed from a material with thermal resistance higher than that of the first resin layer 20.

The surface of the second resin layer 22 has a higher degree of flatness than, for example, the uneven surface of the passivation film 16.

A wiring 30 is formed on the semiconductor substrate 10. More specifically, the wiring 30 extends from a top surface of the electrode 14, passing on a top surface of the second resin layer 22 above the passivation film 16, and reaches a top surface of the second resin layer 22 above the first resin layer 20. The wiring 30 is electrically connected to the electrode 14 on a top surface of the electrode 14. The wiring 30 and the electrode 14 may be directly contacted with each other, or may be coupled through a conductive film (not shown) provided between them. The wiring 30 is formed in a manner to extend over an end section of the first resin layer 20 on the opposite side of the electrode 14, and reach a top surface of the second resin layer 22. The wiring 30 is formed tightly contacting with the second resin layer 22 between the electrode 14 and the first resin layer 20. In accordance with the present embodiment, because a forming surface on which the wiring 30 is formed can be made smoother than the uneven surface of the passivation film 16 by the second resin layer 22, the reliability of the wiring 30 that is formed on the forming surface can be improved.

FIGS. 2A-2D are figures for describing a method for manufacturing a semiconductor device in accordance with an embodiment of the invention. In the present embodiment, a semiconductor substrate 10 is prepared. The semiconductor substrate 10 has a passivation film 16 whose surface is uneven because it is formed above an integrated circuit 12, and an electrode 14 that is electrically connected to the integrated circuit 12 and has at least a portion exposed through the passivation film 16.

Figure 2A:
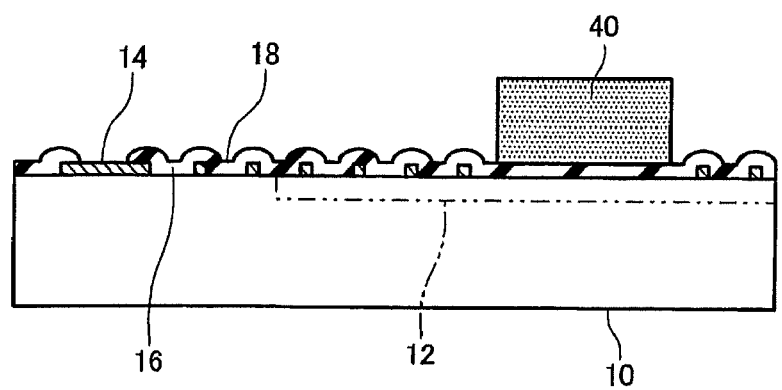
FIGS. 2A-2D are figures for describing a method for manufacturing a semiconductor device in accordance with an embodiment of the invention.
Figure 2B:
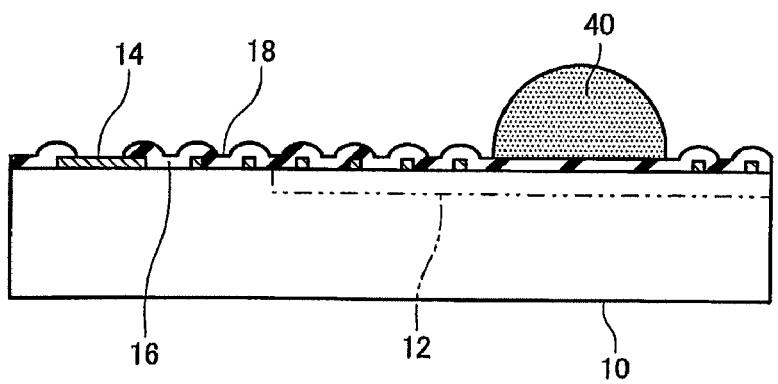

A first resin layer 20 is formed on the passivation film 16. For example, as shown in FIG. 2A, a thermosetting first resin precursor layer 40 is formed. Then, as shown in FIG. 2B, the first resin precursor layer 40 is heated. By heat, the first resin precursor layer 40 temporarily melts and becomes semispherical by surface tension, and the first resin layer 20 is formed as it hardens.

Figure 2C:
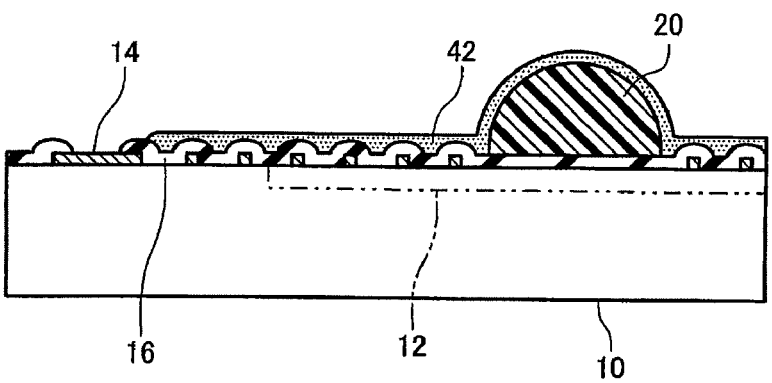
Figure 2D:
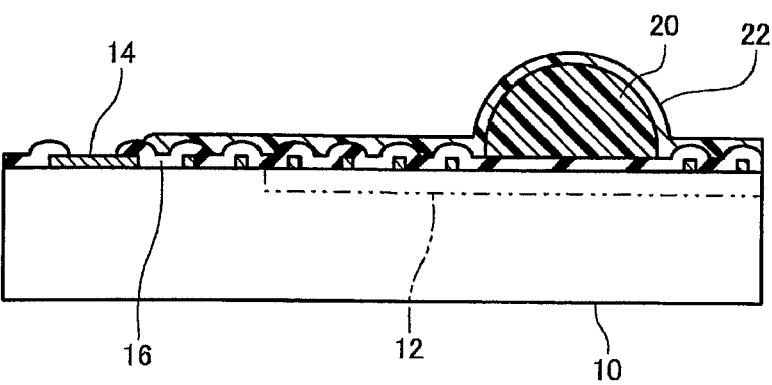

A second resin layer 22 is formed in a manner to cover the passivation film 16 and the first resin layer 20. For example, as shown in FIG. 2C, a thermosetting second resin precursor layer 42 is formed. Then, as shown in FIG. 2D, the second resin precursor layer 42 is hardened thereby forming the second resin layer 22.

According to the present embodiment, because the surface of the second resin layer 22 can be made smoother than the uneven surface of the passivation film 16 by the second resin layer 22, the reliability of the wiring 30 that is formed thereon can be improved. Also, the second resin precursor layer 42 has higher thermal resistance than that of the first resin precursor layer 40. Therefore, the second resin layer 22 has higher thermal resistance than that of the first resin layer 20. Accordingly, the first resin layer 20 is protected from heat by the second resin layer 22.

Then, as shown in FIG. 1, a wiring 30 is formed to extend from a top surface of the electrode 14, extending on the second resin layer 22 above the passivation film 16, and reach a top surface of the second resin layer 22 above the first resin layer 20. When sputtering is applied to form the wiring 30, its film thickness would become irregular, if formed on a passivation film 16 in prior art as it has an uneven surface. There is a possibility that this could lead to an increase in the resistance value and line breakage. However, in accordance with the present embodiment, since the flatness of the surface is improved, such problems as described above can be avoided. Description of other details of the manufacturing method is omitted as they are obvious from the structure of the semiconductor device described above.

The invention is not limited to the embodiments described above, and many modifications can be made. For example, the invention may include compositions that are substantially the same as the compositions described in the embodiments (for example, a composition with the same function, method and result, or a composition with the same objects and result). Also, the invention includes compositions in which portions not essential in the compositions described in the embodiments are replaced with others. Also, the invention includes compositions that achieve the same functions and effects or achieve the same objects of those of the compositions described in the embodiments. Furthermore, the invention includes compositions that include publicly known technology added to the compositions described in the embodiments.

What is claimed is:

1. A semiconductor device comprising:
    a semiconductor substrate that has an integrated circuit, a passivation film formed above the integrated circuit, and an electrode electrically connected to the integrated circuit, the electrode having at least a portion exposed through the passivation film;
    a first resin layer that is disposed on the passivation film;
    a second resin layer that covers a first part of the passivation film and the first resin layer, the first part of the passivation film having an uneven surface; and
    a wiring that extends from the electrode to a first part of the second resin layer disposed above the first resin layer, the wiring passing over a second part of the second resin layer disposed above the uneven surface of the passivation film.

2. A semiconductor device according to claim 1, wherein the second resin layer has thermal resistance higher than thermal resistance of the first resin layer.

3. A method for manufacturing a semiconductor device, comprising the steps of:
    preparing a semiconductor substrate having a passivation film, and an electrode electrically connected to the integrated circuit, the electrode having at least a portion exposed through the passivation film;
    forming a first resin layer on the passivation film;
    forming a second resin layer that covers a first part of the passivation film and the first resin layer, the first part of the passivation film having an uneven surface; and
    forming a wiring that extends from the electrode to a first part of the second resin layer disposed above the first resin layer, the wiring passing over a second part of the second resin layer above the uneven surface of the passivation film.

4. A method for manufacturing a semiconductor device according to claim 3, wherein
    the forming of the first resin layer includes forming a thermosetting first resin precursor layer and heating the first resin precursor layer, and
    the forming of the second resin layer includes forming a thermosetting second resin precursor layer after heating and setting the first resin precursor layer.

5. A method for manufacturing a semiconductor device according to claim 4, wherein the second resin precursor layer has thermal resistance higher than thermal resistance of the first resin precursor layer.

* * * * *